United States Patent
Santos et al.

(10) Patent No.: US 12,088,309 B2
(45) Date of Patent: Sep. 10, 2024

(54) CONTROL ARRANGEMENT AND METHOD

(71) Applicant: IQM Finland Oy, Espoo (FI)

(72) Inventors: Jorge Santos, Espoo (FI); Pasi Lähteenmäki, Espoo (FI)

(73) Assignee: IQM Finland Oy, Espoo (FI)

( * ) Notice: Subject to any disclaimer, the term of this patent is extended or adjusted under 35 U.S.C. 154(b) by 71 days.

(21) Appl. No.: 17/797,539

(22) PCT Filed: Feb. 4, 2021

(86) PCT No.: PCT/FI2021/050077
§ 371 (c)(1),
(2) Date: Aug. 4, 2022

(87) PCT Pub. No.: WO2021/156545
PCT Pub. Date: Aug. 12, 2021

(65) Prior Publication Data
US 2023/0049369 A1  Feb. 16, 2023

(30) Foreign Application Priority Data

Feb. 7, 2020 (EP) ..................................... 20156207

(51) Int. Cl.
*H03L 7/099* (2006.01)
*G06F 1/08* (2006.01)
*G06F 1/10* (2006.01)
*G06N 10/40* (2022.01)
*H03K 5/01* (2006.01)

(52) U.S. Cl.
CPC ................ *H03L 7/099* (2013.01); *G06F 1/08* (2013.01); *G06F 1/10* (2013.01); *G06N 10/40* (2022.01); *H03K 5/01* (2013.01)

(58) Field of Classification Search
CPC . H03L 7/099; H03L 7/16; H03L 7/093; H03L 7/085; H03L 7/087; H03L 7/23; G06F 1/08; G06F 1/10; G06F 1/06; G06N 10/40; H03K 5/01; H03K 5/135; H04B 7/0417; H04B 7/0617; H04B 7/12; H04B 7/0413
See application file for complete search history.

(56) References Cited

U.S. PATENT DOCUMENTS

| | | | |
|---|---|---|---|
| 10,938,465 B1 * | 3/2021 | Mehrnia | H04B 7/0617 |
| 2008/0205550 A1 | 8/2008 | Rofougaran | |
| 2018/0159541 A1 * | 6/2018 | Spijker | H03L 7/0991 |
| 2019/0319631 A1 * | 10/2019 | Buliga | H04B 7/0417 |
| 2020/0034736 A1 * | 1/2020 | Mueller | G06N 10/00 |

OTHER PUBLICATIONS

Extended EP Search Report for application EP Application No. 20156207.1 mailed Jul. 31, 2020.
International Search Report and Written Opinion for PCT Application PCT/FI2021/050077 mailed Apr. 30, 2021.

\* cited by examiner

*Primary Examiner* — John W Poos
(74) *Attorney, Agent, or Firm* — Meunier Carlin & Curfman LLC (57) ABSTRACT

A control arrangement is disclosed for providing a plurality of phase-coherent oscillating signals. It comprises a reference clock signal arrangement for providing a high-frequency reference clock signal and a plurality of modules each comprising a plurality of channels for providing the plurality of phase-coherent oscillating signals.

16 Claims, 3 Drawing Sheets

CONTROL ARRANGEMENT AND METHOD

CROSS-REFERENCE TO RELATED APPLICATIONS

The present application is a national phase entry of International Application No. PCT/FI2021/050077, filed Feb. 4, 2021, which claims priority to European Application No. 20156207.1, filed Feb. 7, 2020, which are each incorporated herein by reference in their entirety.

FIELD

The disclosure relates to providing phase-coherent oscillating signals. In particular, the phase-coherent oscillating signals can be used as inputs to a quantum computing system.

BACKGROUND

Phase-coherence has become increasingly important for many modern technologies. For example, technologies like quantum nanoelectronics and quantum computing involve the use of special circuitry that operates at extremely low temperatures that can only be achieved with advanced cryogenic cooling techniques. Oscillating signals on microwave frequencies, for example in the order of some GHz, can be used as inputs to these circuits. There is thus the need to be able to generate such signals at desired frequency, amplitude, and phase.

In particular, a characterizing feature for modern systems such as quantum computing systems is that for their inputs the phase information has to be extremely predictable. For a quantum computing system providing several qubits, the coherence that needs to be preserved in the phase degree of freedom of a quantum superposition is not only internal to the qubits, but also includes that of the qubits relative to each other. With the increase of the number of qubits required for practical applications in quantum computation, the system needs to be scalable in a manner that is effective both in cost and space, while keeping the system relatively simple to set up and be used by the operator.

While there are some phase-coherent microwave generators on the market, these have a limited number of coherent channels and no easy way to scale up the number. These options are also not cost-effective for large systems.

SUMMARY

It is an objective to disclose an arrangement and a method for providing phase-coherent oscillating signals, which can be used as inputs to a highly phase-coherent system such as a quantum computing system, while avoiding or at least mitigating the problems of prior art described above.

Another objective is that to provide a solution that is scalable to operate on a large number of signal channels, for example on tens, hundreds or even thousands of channels. A further objective is to provide a modular solution, which allows easy expansion of the number of coherent channels in a cost-effective manner.

These and further advantageous objectives may be achieved with an arrangement utilizing a single-clock source for a plurality of channels.

Herein, "phase-coherence" for a pair of oscillating signals may refer to phase-relation for the two oscillating signals being predictable, in particular from the construction of the arrangement providing the pair. Alternatively, this may be described as the phase-relation being deterministic. Two or more phase-coherent oscillating signals may have a same frequency, but they may also have a different frequency. When two or more phase-coherent oscillating signals have a same frequency, they may have a constant phase difference, for example a zero phase-difference but also a different constant phase difference as long as it is predictable. When two or more phase-coherent oscillating signals have a different frequency, their phase-relation can still be predicted as the phase difference changes temporally in a phase-coherent manner. Phase coherence corresponding to an offset frequency, which corresponds to the frequency difference between two phase-coherent oscillating signals, may also be advantageously used for quantum computing applications.

Herein, expressions such as "upconversion" and to "upconvert" may refer to increasing the frequency of a signal or utilizing a signal having a first frequency to provide a signal having a second frequency, wherein the second frequency is larger than the first frequency. This may be accomplished in a phase-coherent manner so that the phase relation of the signal before and after the upconversion is deterministic, for example the phase difference for the signal before and after the upconversion being zero or constant. Any upconversion referred herein may involve an increase in frequency by at least a factor of 2-5 or even more, for example 10-20 or more. Any upconversion referred herein may be performed utilizing one or more integer multipliers for frequency. Also dividers may be used.

According to a first aspect a control arrangement for providing a plurality of phase-coherent oscillating signals is disclosed. The control arrangement comprises a reference clock input arrangement for providing a high-frequency reference clock signal. The high-frequency reference clock signal can be provided directly or indirectly from a reference clock generator. The control arrangement further comprises a plurality of modules each comprising a plurality of channels for providing the plurality of phase-coherent oscillating signals. The control arrangement comprises a first distribution arrangement for distributing the high-frequency reference clock signal in a phase-coherent manner to the plurality of modules and, within each of the plurality of modules, a second distribution arrangement for distributing the high-frequency reference clock signal in a phase-coherent manner to the plurality of channels of the respective module. The control arrangement comprises within each of the plurality of channels a first phase-locked loop configured to upconvert the high-frequency reference clock signal for providing one of the plurality of phase-coherent oscillating signals. Finally, the control arrangement may also comprise a plurality of output transmission lines for coupling to a receiving system such as a quantum computing system so that each of the plurality of output transmission lines couples one of the plurality of channels to the receiving system.

According to a second aspect a method for providing a plurality of phase-coherent oscillating signals is disclosed. The method comprises receiving a high-frequency reference clock signal and distributing the high-frequency reference clock signal in a phase-coherent manner to a plurality of modules. A reference clock generator may be arranged for providing a reference clock signal for directly or indirectly providing the high-frequency reference clock signal. The method further comprises, within each of the plurality of modules, distributing the high-frequency reference clock signal in a phase-coherent manner to a plurality of channels of the respective module and, within each of the plurality of channels, upconverting the high-frequency reference clock signal for providing one of the plurality of phase-coherent oscillating signals. Finally, the method comprises outputting the plurality of phase-coherent oscillating signals. The method allows outputting the plurality of phase-coherent oscillating signals for a receiving system such as a quantum computing system through a plurality of output transmission lines for coupling to the receiving system so that each of the plurality of output transmission lines couples one of the plurality of channels to the receiving system. For providing the plurality of phase-coherent oscillating signals, a control arrangement, such as the control arrangement of the first aspect, can be used.

In both aspects, the modules provide scalability allowing increase of the total number of channels of the control arrangement in an efficient and yet phase-coherent manner. The arrangement and method allow the phase locked-loop of each of the plurality of channels to be deterministically coupled to a single reference clock signal, such as the high-frequency reference clock signal. The high-frequency clock signal may be provided from a reference clock generator or be deterministically coupled to a reference clock signal, such as an initial reference clock signal, which can be provided directly or indirectly from a reference clock generator. This can be used for providing the plurality of phase-coherent oscillating signals, in contrast to some prior systems utilizing dedicated clocks for signal generators. Even for phase-coherent oscillating signals having different frequencies, the frequency difference is due to a single reference clock signal, such as the initial reference clock signal. Consequently, any temporally evolving phase differences can be deterministically predicted. In both aspects, the high-frequency reference clock signal can be provided as an ultra-low phase-noise reference clock signal. This allows providing the plurality of phase-coherent oscillating signals with minimized phase-noise. In particular, the high-frequency reference clock signal may be an ultra-low phase-noise reference clock signal for quantum computing. The disclosed control arrangement and method then allow the plurality of phase-coherent oscillating signals to be provided with minimized phase noise for quantum computing. Both aspects allow providing phase-coherence high enough for the phase-coherent oscillating signals to be suitable for use as inputs to a quantum computing system.

In an embodiment, the reference clock input arrangement comprises a reference clock signal input for providing an initial reference clock signal and an initial phase-locked loop, which is coupled to the reference clock signal input and configured to upconvert the initial reference clock signal for providing the high-frequency reference clock signal.

In an embodiment, the method comprises receiving an initial reference clock signal and upconverting the initial reference clock signal for providing the high-frequency reference clock signal, for example utilizing an initial phase-locked loop.

Upconvert an initial reference clock signal for providing the high-frequency reference clock signal allows providing very high quality high-frequency reference clock signals to be provided, which may also have ultra-low phase noise. For this purpose, reference clock generator for providing a frequency lower than the frequency of the high-frequency reference clock signal may be utilized. This allows using some of the very high quality reference clock generators available at lower frequencies such as 5-50 MHz, in particular at and around 10 MHz, for example comprising a rubidium oscillator for providing the initial reference clock signal.

In an embodiment, the reference clock input arrangement comprises a motherboard arrangement and each of the plurality of modules comprises a second circuit board. This allows the modules to be introduced into the arrangement as individual units on a circuit board, the number and positioning of which can be efficiently controlled. The initial phase-locked loop can be arranged on the motherboard arrangement. The initial phase-locked loop can be arranged on the motherboard arrangement.

In an embodiment, the reference clock signal arrangement comprises a motherboard arrangement and the plurality of modules is arranged for pluggable coupling to the motherboard arrangement. This allows the number of modules to be increased easily. The coupling may be releasable allowing the number of modules to be decreased easily as well. The pluggable coupling may be arranged by means of an edge connector, for example by a PCI Express connector. While the physical structure of the connector may correspond to a PCI Express-connector, the data transfer protocol and/or pin allocation may also differ from those of PCI Express interfaces. The initial phase-locked loop can be arranged on the motherboard arrangement.

The first distribution arrangement allows the high-frequency reference clock signal to be distributed to the modules while this signal still has a frequency smaller than the frequency of any of the plurality of phase-coherent oscillating signals. This is particularly advantageous when edge connectors are used for the pluggable coupling as the coupling takes place at the smaller frequency, for example of some hundred MHz or less.

In an embodiment, each of the plurality of modules comprises a plurality of shields for radio-frequency (rf) shielding of each of the plurality of channels of the respective module. This allows channel-specific rf shielding in an efficient manner as the channels can be shielded not only from the environment but also from each other.

In an embodiment, the initial reference clock signal has a frequency of 5-50 MHz. This frequency may correspond to the nominal frequency for the initial reference clock signal. The accuracy of the frequency may be high, even 5e-11 (+/−) or better. It has been found that in some embodiments an accuracy of 20 ppm (+/−) or better for the frequency can be advantageously used for maintaining phase-coherence. This can be used, for example, when the initial reference clock signal is provided utilizing a reference clock signal from a rubidium oscillator. In some embodiments, the frequency can be 10 MHz, which has been found to be particularly utilizable for upconversion at the initial phase-locked loop, for example due to its compatibility with integer factors. In this case, the accuracy may also be high, even 5e-11 (+/−) or better and an accuracy 20 ppm (+/−) or better can be advantageously used for maintaining phase-coherence. Herein, the "accuracy" of the frequency may also refer to a maximal deviation from the nominal frequency, which allows maintaining phase coherence between the initial reference clock signal and the high-frequency reference clock signal.

In an embodiment, the high-frequency reference clock signal has a frequency of 100-250 MHz. This frequency may correspond to the nominal frequency for the high-frequency reference clock signal. Both the minimum frequency 100 MHz and the maximum frequency 250 MHz have been found to provide notably improved compatibility for the arrangement. The accuracy of the frequency may be high, and it has been found that in some embodiments an accuracy of 20 ppm (+/−) or better for the frequency can provide notable benefits.

In an embodiment, the plurality of phase-coherent oscillating signals has a frequency of 1-15 GHz. This frequency may correspond to the nominal frequency for a phase-coherent oscillating signal. These frequencies have been found to be particularly efficiently usable for quantum computing with the present disclosure.

In an embodiment, the amplitude and/or frequency of at least one of the plurality of phase-coherent oscillating signals is adjustable by a digital control signal for the respective channel.

In an embodiment, the control arrangement comprises a control connection for remote adjustment of the frequency and/or amplitude of the plurality of phase-coherent oscillating signals. The control connection may comprise a wired and/or wireless connection.

In an embodiment, the method comprises adjusting the amplitude and/or frequency of at least one of the plurality of phase-coherent oscillating signals by a digital control signal for the respective channel. The adjustment may be performed remotely.

The individual adjustability for the plurality of phase-coherent oscillating signals markedly improves the flexibility of the solution.

According to a third aspect, a generator arrangement for providing a plurality of phase-coherent oscillating signals is disclosed. The generator arrangement comprises the control arrangement according to the first aspect or any of its embodiments and a reference clock generator arranged for providing a reference clock signal for providing the high-frequency reference clock signal. The reference clock signal may be provided to the reference clock input arrangement. It may be provided directly as the high-frequency reference clock signal or indirectly, for example as the initial reference clock signal, which may be upconverted by the reference clock input arrangement to provide the high-frequency reference clock signal.

In an embodiment, the reference clock generator has an accuracy of 20 ppm (+/−) or better for providing the reference clock signal. The accuracy is defined with respect to the frequency of the reference clock signal.

According to a fourth aspect, a quantum computing arrangement comprises a control arrangement according to the first aspect or any of its embodiments and a quantum computing system, wherein the control arrangement is coupled to the quantum computing system for providing a plurality of phase-coherent oscillating signals for the quantum computing system. The arrangement may also comprise a reference clock generator arranged for providing a reference clock signal to the reference clock input arrangement for providing the high-frequency reference clock signal.

It is to be understood that the aspects and embodiments described above may be used in any combination with each other. Several of the aspects and embodiments may be combined together to form a further embodiment of the invention.

BRIEF DESCRIPTION OF THE DRAWINGS

The accompanying drawings, which are included to provide a further understanding and constitute a part of this specification, illustrate examples and together with the description help to explain the principles of the disclosure. In the drawings.

Like references are used to designate equivalent or at least functionally equivalent parts in the accompanying drawings.

DETAILED DESCRIPTION

The detailed description provided below in convection with the appended drawings is intended as a description of examples and is not intended to represent the only forms in which the example may be constructed or utilized. However, the same or equivalent functions and structures may be accomplished by different examples.

Figure 1:
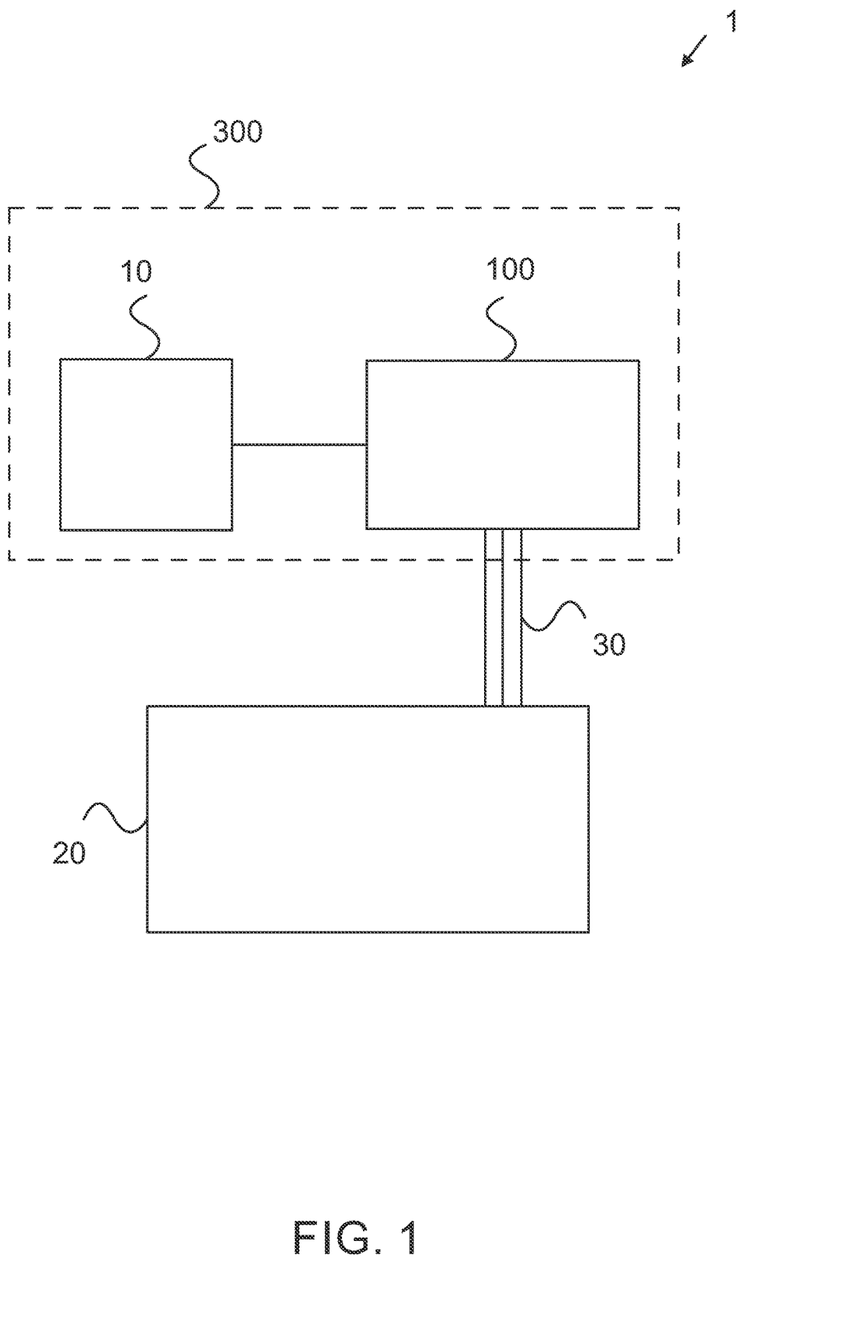
FIG. 1 schematically illustrates a first arrangement according to an example.

FIG. 1 illustrates a first arrangement 1 according to an example. The first arrangement 1 is an arrangement for providing and/or utilizing phase-coherent oscillating signals, such as a quantum computing arrangement. The first arrangement 1 comprises, at least, a control arrangement 100 for providing a plurality of phase-coherent oscillating signals. It may further comprise a receiving system 20 for the plurality of phase-coherent oscillating signals, such as a quantum computing system. The first arrangement 1 may also comprise a reference clock generator 10. The reference clock generator 10 and the control arrangement 100 may be coupled together releasably or non-releasably, for example on the same support. The first arrangement 1 may be a generator arrangement 300 comprising, at least, a reference clock generator 10 and control arrangement 100. The first arrangement 1 may comprise a coupling arrangement 30 for coupling the control arrangement 100 to the receiving system 20 for providing a plurality of phase-coherent oscillating signals for the receiving system 20.

The reference clock generator 10 is configured for providing an initial reference clock signal. The reference clock generator 10 may have a high accuracy for output frequency, for example 20 ppm (+/−) or better. The reference clock generator 10 may comprise a crystal oscillator for providing the initial reference clock signal. In some embodiments, the reference clock generator 10 comprises a rubidium oscillator for providing the initial reference clock signal. The reference clock generator 10 may be integrated with the control arrangement 100 or it may be an external reference clock generator. As an example, FS725 of Stanford Research Systems may be used for the reference clock generator. The reference clock generator 10 may have a low phase noise at different offset frequencies.

The receiving system 20 is a system utilizing phase-coherent oscillating signals, such as a quantum computing system. A quantum computing system may be arranged for providing a plurality of qubits. The receiving system 20 may comprise or be operated within a cryostat for providing cryogenic cooling.

The coupling arrangement 30 may comprise a plurality of transmission lines for coupling the control arrangement 100 to the receiving system 20, for example by releasable coupling. The coupling arrangement 30 may further comprise one or more mixers (not illustrated), such as frequency mixers, for modulating the plurality of phase-coherent oscillating signals. In some embodiments, the one or more mixers are located within a cryostat. The plurality of phase-coherent oscillating signals may comprise one or more carrier signals, which can thereby be mixed with a modulating signal, such as a control signal for a qubit for the receiving system 20.

Figure 2:
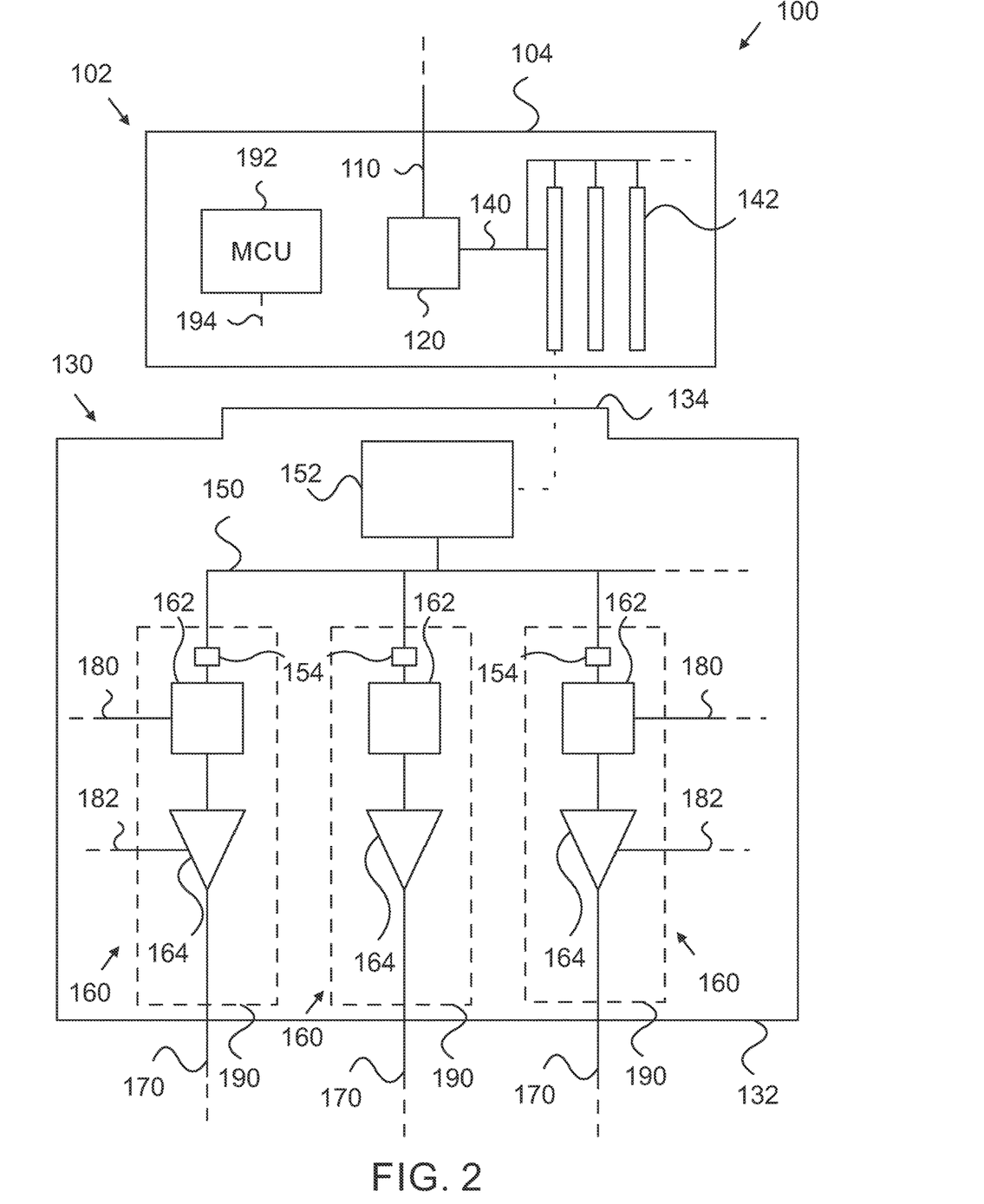
FIG. 2 schematically illustrates a control arrangement according to an example, and FIG. 3 schematically illustrates a method according to an example.

FIG. 2 illustrates a control arrangement 100 according to an example. The control arrangement 100 comprises a reference clock input arrangement 102 for providing a high-frequency reference clock signal. The high-frequency reference clock signal may be provided directly or indirectly from the reference clock generator 10. This signal can be provided from the reference clock generator 10 as disclosed above. The frequency of the high-frequency reference clock signal may be, for example 50-1000 MHz. In some embodiments, the frequency may be at least 100 MHz and/or at most 250 MHz, both of the upper and the lower limit having been found to provide improved functionality for the control arrangement 100, alone or in combination. Any frequency here may correspond to the nominal frequency of the reference clock generator 10.

The reference clock input arrangement 102 may comprise a reference clock signal input 110 for inputting an initial reference clock signal. This allows indirectly providing the high-frequency reference clock signal from the reference clock generator 10. The reference clock generator 10 may be utilized for providing the initial reference clock signal. The reference clock input arrangement 102 may then comprise an initial phase-locked loop 120, which is coupled to the reference clock signal input 110 for providing a high-frequency reference clock signal, for example having a frequency of 100-250 MHz. For this purpose, the initial phase-locked loop may comprise an oscillator of the corresponding frequency.

The frequency of the initial reference clock signal may be, for example 5-250 MHz. In some embodiments, the frequency may be 5-50 MHz. In particular, the frequency of 10 MHz has been found to provide additional benefits for scalable upconversion. The accuracy for the frequency can be 20 ppm (+/−) or better. Any frequency here may correspond to the nominal frequency of the reference clock generator 10.

In some embodiments, the initial reference clock signal may be a square-wave signal when inputted to the initial phase-locked loop 120. The reference clock input arrangement 102 may comprise a signal processing arrangement for adjusting the properties, such as shape, of the initial reference clock signal, for example situated between the reference clock signal input 110 and the initial phase-locked loop 120.

The control arrangement 100 comprises a plurality of modules 130, where each module comprises a plurality of channels 160 for providing the plurality of phase-coherent oscillating signals. There is no direct upper limit for the number of modules 130. Consequently, the number of modules may be relatively small, for example 4-10, or larger, for example 10-100 or more. Similarly, the number of channels 160 in each of the plurality of modules 130 may be relatively small, for example 4-10, but also larger, for example 10-100 or more.

The reference clock input arrangement 102 may comprise a motherboard arrangement 104 for support and connectivity, for example for the initial phase-locked loop 120 and/or the first distribution arrangement 140. The motherboard arrangement 104 may comprise or be formed by one or more circuit boards arranged as a motherboard. The initial phase-locked loop 120 can be arranged on the motherboard arrangement 104. Similarly, the reference clock signal input 110 may be arranged on the motherboard arrangement 104, for example providing a pluggable coupling for a transmission connection for the initial reference clock signal, such as a transmission line from the reference clock generator 10. Alternatively or additionally, each of the plurality of modules 130 may comprise at least one second circuit board 132 for providing support and connectivity for the respective module. The components of each of the modules 130 may thereby be arranged at one or more module-specific circuit boards, which may be joined as one support. This allows efficient separation of the modules 130 from each other and from the motherboard arrangement 104. Any circuit boards mentioned herein may be printed circuit boards (PCB).

The control arrangement 100 comprises a first distribution arrangement 140 for distributing the high-frequency reference clock signal in a phase-coherent manner to the plurality of modules. The first distribution arrangement 140 may comprise wiring for providing signal paths for the high-frequency reference clock signal to each of the modules 130, for example from the initial phase-locked loop 120. Two or more of the signal paths may be of equal length for maintaining the same phase for the respective modules 130. However, the signal paths may also be of different length since for phase-coherence it is not necessarily required that the phase is conserved as long as the phase-relation is deterministic. The first distribution arrangement 140 may comprise pluggable coupling for the plurality of modules 130. For example, the first distribution arrangement 140 may comprise a plurality of plug/socket connections 142 for the plurality of modules 130, wherein each plug/socket connection comprises a first end and a second end, which are compatible with each other for insertion. A first end 134 of a plug/socket connection, for example a plug, may be arranged at each of the plurality of modules 130. A second end of a plug/socket connection, for example a socket, may be arranged at the reference clock input arrangement 102, for example on the motherboard arrangement 104 thereof. The plug/socket connection may comprise an edge connector, for example a PCI Express connector.

In some embodiments, the high-frequency reference clock signal may be a square-wave signal when provided for the modules 130. The control arrangement 100 may comprise a signal processing arrangement for adjusting the properties, such as shape, of the high-frequency clock signal. It may be arranged at the reference clock input arrangement 102, for example on the motherboard arrangement 104. It may also be situated at or before the first distribution arrangement 140.

The plurality of modules 130 each comprise a second distribution arrangement 150 for distributing the high-frequency reference clock signal in a phase-coherent manner to the plurality of channels 160 of the respective module 130. The second distribution arrangement 150 may comprise wiring for providing signal paths for the high-frequency reference clock signal from the first distribution arrangement 140 to each of the channels 160 of the respective module 130. Two or more of the signal paths may be of equal length for maintaining the same phase for the respective channels 160. However, the signal paths may also be of different length since for phase-coherence it is not necessarily required that the phase is conserved as long as the phase-relation is deterministic. The second distribution arrangement 150 may also comprise one or more signal processing devices 152, such as buffer amplifiers, for processing the high-speed reference clock signal. For example, a buffer amplifier at each of the plurality of modules 130 allows providing a scalable fan-out for the control arrangement 100. The second distribution arrangement 154 may also one or more low-pass filters for low-pass filtering the high-frequency reference clock signal. The low-pass filtering may be performed at a filtering frequency below 1 GHz, for example at 400-700 MHz. In some embodiments, such filtering is performed separately for each of the plurality of channels 160 of the respective module 130. The module 130 may comprise two low-pass filters 154 for each of the plurality of channels 160 to allow filtering from a high-frequency clock signal corresponding to a differential reference clock generator. The low-pass filtering for each of the plurality of channels 160 may be directly coupled to the input of the first phase-locked loop 162 of the respective channel 160. The low-pass filtering may be used to alleviate the output of the channels 160 from leaking back into the first phase-locked loops 162 of the other channels 160, which may weaken the crosstalk between channels 160 at some frequencies, for example above 1 GHz.

Each of the plurality of channels 160 comprises a first phase-locked loop 162 configured to upconvert the high-frequency reference clock signal for providing one of the plurality of phase-coherent oscillating signals. In an embodiment, each of the plurality of phase-coherent oscillating signals may have a frequency of 1-15 GHz, making them particularly suitable for quantum computing, for example to be used as carrier signals. Each of the plurality of channels 160 may also comprise an amplifier 164, such as a radio-frequency amplifier, for amplifying the amplitude of the respective phase-coherent oscillating signal. In some embodiments, the amplifier 164 is a voltage-controlled amplifier. In some embodiments, the amplification of the amplifier 164 can be controlled by a digital-to-analog converter, which provides a voltage to an operational amplifier, which in turn powers the amplifier 164. The amplifier 164 may be coupled at the output of the respective first phase-locked loop 162.

The amplitude and/or frequency of the plurality of phase-coherent oscillating signals may be adjustable individually, in a channel-specific manner, and/or collectively, for example for all channels at once. A module 130 may comprise one or more adjustment interfaces 180, 182 for each of the plurality of channels 160 for this purpose. A first adjustment interface 180, for example a Serial Peripheral Interface (SPI), may be provided for adjusting the frequency of a phase-coherent oscillating signal. For providing the adjustment, the first adjustment interface 180 may be coupled to the first phase-locked loop 162 of the channel 160 for providing the phase-coherent oscillating signal. A second adjustment interface 182, for example a control voltage input, may be provided for adjusting the amplitude of a phase-coherent oscillating signal. For providing the adjustment, the second adjustment interface 182 may be coupled to the amplifier of the channel 160 for providing the phase-coherent oscillating signal. The adjustment in either or both cases may be performed via a digital control signal. The digital control signal may be provided channel-specifically so that the amplitude and/or frequency for only a limited number of channels, such as one channel, is adjusted.

The control arrangement 100 may comprise a plurality of transmission lines 170 for coupling to the receiving system 20. This can be performed so that each of the plurality of transmission lines 170 couples one of the plurality of channels 160 to the receiving system 20. The coupling may be direct or indirect, for example through a coupling arrangement 30, which may comprise one or more signal processing devices such as mixers. The plurality of transmission lines may form a part of the coupling arrangement 30.

The control arrangement 100 may comprise a plurality of rf connections for providing the plurality of phase-coherent oscillating signals, all of which may be impedance matched. The control arrangement 100 may also comprise rf shielding for the plurality of channels 160 of each of the plurality of modules 130. Each of the plurality of modules 130 may comprise a plurality of shields 190 for rf shielding. The rf shielding can be performed separately for each of the plurality of channels 160 of the respective module 130 so that these channels are shielded also with respect to each other. Each shield may comprise, for example, a cover for rf shielding of the respective channel 160. The shields may be at least partially metallic for providing the rf shielding, for example at least partially of sheet metal. For example, the plurality of shields 190 may comprise a plurality of separate screening boxes for rf shielding of respective channels 160. In an embodiment, each of the plurality of channels 160 is separately covered for rf shielding by a shield 190 comprising sheet metal.

For providing the plurality of phase-coherent oscillating signals, the control arrangement 100 may comprise one or more additional devices and/or components such as demultiplexers, digital-to-analog-converters and power supply units. These may be integrated as part of the plurality of modules 130. The control arrangement 100 may comprise one or more controllers 192, for example microcontrollers. For example, a central controller may be positioned on the motherboard arrangement 104. The controller 192 may be configured for adjusting the frequency and/or amplitude of the phase-coherent oscillating signals, for example by a channel-specific adjustment. For this purpose, it may be coupled to one or more demultiplexers. This can be used for providing channel-specific digital control signal for adjusting frequency and/or amplitude of the respective phase-coherent oscillating signal. For example, each of the plurality of modules may comprise a demultiplexer for this purpose. The control arrangement 100 may comprise a control interface 194 for coupling the controller 192 to other components, which interface 194 may comprise also a Serial Peripheral Interface (SPI), which may be arranged for coupling with a corresponding SPI at the plurality of channels 160 of each of the plurality of modules 130. The interface 194 may be coupled to the plurality of modules 130 through the first distribution arrangement 140, for example through the plug/socket connection 142.

In following, further examples of adjusting frequency and/or amplitude of a phase-coherent oscillating signal are provided. The controller 192 may be coupled to a demultiplexer, which may be provided as a signal processing device 152 of the second distribution arrangement 150. It may be used to provide an address, for example of n bits, which directs a demultiplexed signal, for example a Chip Select (CS) signal, to a digital-to-analog converter or to a first phase-locked loop 162, which may be coupled to the control interface 194, such as SPI. The control interface 194 may comprise at least one path for data and at least one path for clock value, which may be in coupled in series with multiple digital-to-analog converters and/or first phase-locked loops 162 but only one of them is effected at a time as indicated by the demultiplexed signal. The digital-to-analog converter may be configured to direct a voltage to a prior amplifier, such as an operational amplifier, which can provide a sufficient input, such as an input current, to the amplifier 164 for adjusting the amplitude of the phase-coherent oscillating signal. In some embodiment, the amplification of the amplifier 164 for adjusting the amplitude of the phase-coherent oscillating signal is dependent on operating voltage, which may be programmed in the digital-to-analog converter.

The control arrangement 100 may also comprise a control connection for remote adjustment of the frequency and/or amplitude of the plurality of phase-coherent oscillating signals. The control connection may be coupled to the controller 192. The control connection may comprise a wired and/or a wireless connection for the remote adjustment. For the remote adjustment, the control connection may be arranged to be coupled to a data processing device such as a computer. In some embodiments, the control connection comprises an Ethernet and/or an Universal Serial Bus (USB) connection for the remote adjustment. The control arrangement 100 may also be configured for adjusting other parameters of the initial phase-locked loop 120 and/or any of the first phase-locked loops 162, for example utilizing the control connection for remote adjustment.

The output power of each of the plurality of channels may be controlled by dc biasing, for example by dc biasing the amplifier 164. For this purpose, the control arrangement 100 may comprise one or more digital-to-analog circuits, for example 16-bit digital-to-analog circuits. In some embodiments, each of the plurality of modules 130 comprises a separate digital-to-analog circuit for each of the plurality of channels 160 of the respective module 130 for said purpose.

While the phase-coherence between different channels can be maintained by the control arrangement 100, the control arrangement 100 may be arranged for channel-specific definition of the absolute phase at a point in time, for example that the phase-difference between any two phase-coherent oscillating signals is zero at a point in time. The phases for the phase-coherent oscillating signals thereafter evolve temporally in accordance with the laws of physics and their values can be predicted accordingly.

Figure 3:
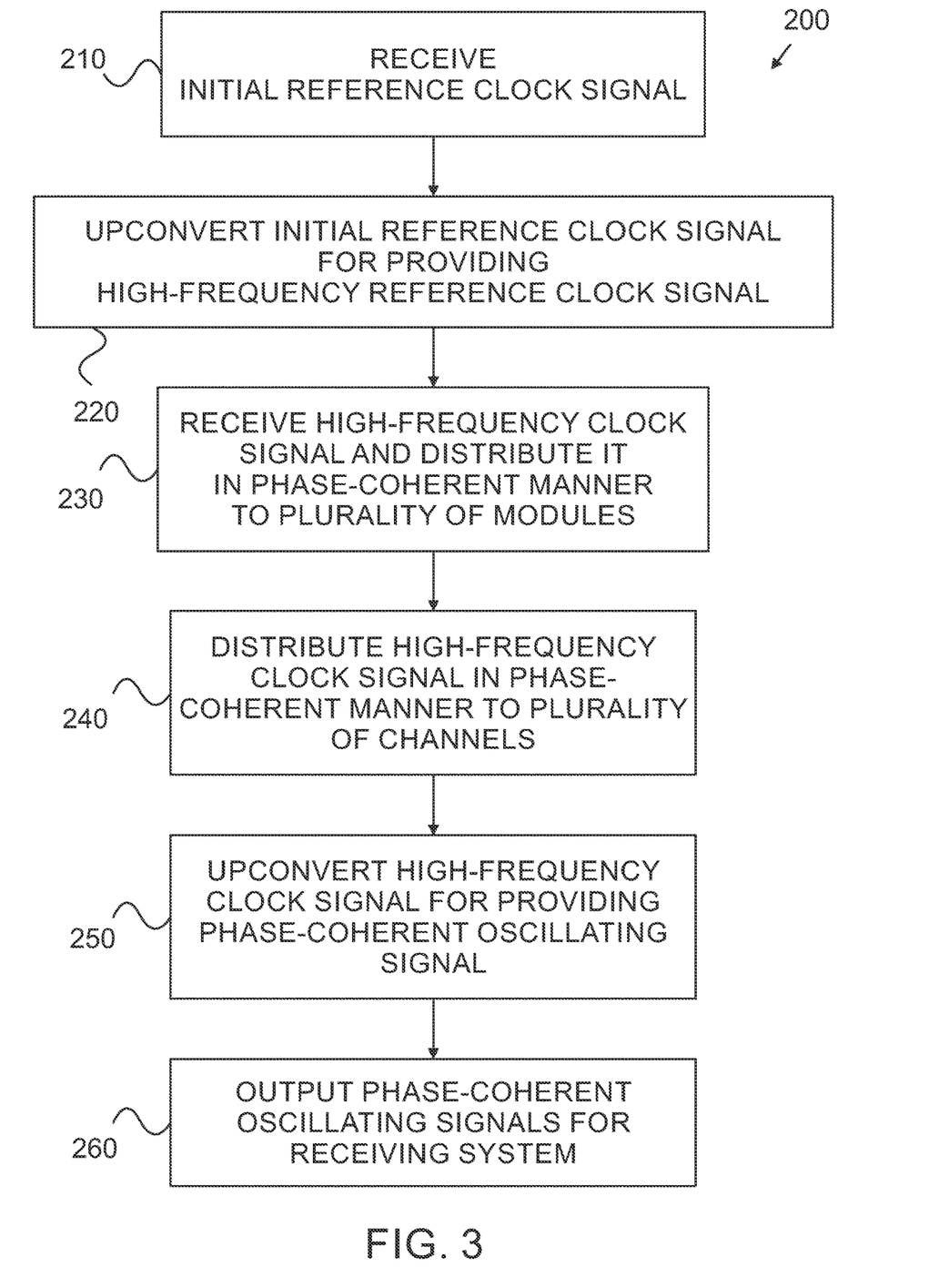

FIG. 3 illustrates a method 200 according to an example. The method 200 can be used for providing a plurality of phase-coherent oscillating signals, for example for a quantum computing system.

In an embodiment, the method 200 comprises receiving 210 an initial reference clock signal. The initial reference clock signal may be generated utilizing a reference clock generator 10, for example according to any of the examples disclosed herein. The method then comprises upconverting 220 the initial reference clock signal for providing a high-frequency reference clock signal. For this purpose, a control arrangement 100 may be used, for example according to any of the examples disclosed herein.

Regardless of whether the high-frequency signal is provided directly or indirectly, for example utilizing upconversion as described in the previous embodiment, the method 200 comprises receiving 230 the high-frequency clock signal and distributing the high-frequency reference clock signal in a phase-coherent manner to a plurality of modules. Within each of the plurality of modules, the high-frequency reference clock signal is then distributed 240 in a phase-coherent manner to a plurality of channels of the respective module, and within each of the plurality of channels, the high-frequency reference clock signal is upconverted 250 for providing one of the plurality of phase-coherent oscillating signals. The phase-coherent oscillating signals may then be outputted 260 for a receiving system 30 such as a quantum computing system. Before introducing the phase-coherent oscillating signals into the receiving system 30, they may be processed for example by mixing them with another signal such as a modulating signal, for example by frequency mixing. For any or all of these purposes, a control arrangement 100 may be used, for example according to any of the examples disclosed herein. One or more of the phase-coherent oscillating signals may be utilized as carrier waves, for example for a quantum computing system.

For upconversion, integer multipliers may be used. These may be utilized by the initial phase-locked loop 120 and/or any of the first phase-locked loops 162. They have been found to provide improved stability of phase for the phase-coherent oscillating signals. While also dividers may be used, in some embodiments the upconversion at the initial phase-locked loop 120 and/or at each of the first phase-locked loops for providing the plurality of phase-coherent oscillating signals is performed utilizing integer multipliers without dividers. This allows improved phase-stability.

The control arrangement 100 and/or method 200 disclosed herein may also be utilized in conjunction of, for example, a radar system, a spectroscopy system or a radio astronomy system. The receiving system 20 may thus be or comprise any such system alone or in combination.

The different functions discussed herein may be performed in a different order and/or concurrently with each other. Any example may be combined with another example unless explicitly disallowed.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts are intended to be within the scope of the claims.

It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item may refer to one or more of those items.

The term 'comprising' is used herein to mean including the method, blocks or elements identified, but that such blocks or elements do not comprise an exclusive list and a method or apparatus may contain additional blocks or elements.

Numerical descriptors such as 'first', 'second', and the like are used in this text simply as a way of differentiating between parts that otherwise have similar names. The numerical descriptors are not to be construed as indicating any particular order, such as an order of preference, manufacture, or occurrence in any particular structure.

Expressions such as 'plurality' are in this text to indicate that the entities referred thereby are in plural, i.e. the number of the entities is two or more.

Although the invention has been the described in conjunction with a certain type of apparatus and/or method, it should be understood that the invention is not limited to any certain type of apparatus and/or method. While the present inventions have been described in connection with a number of examples, embodiments and implementations, the present inventions are not so limited, but rather cover various modifications, and equivalent arrangements, which fall within the purview of the claims. Although various examples have been described above with a certain degree of particularity, or with reference to one or more individual embodiments, those skilled in the art could make numerous alterations to the disclosed examples without departing from the scope of this specification. It is also obvious to a person skilled in the art that with the advancement of technology, the basic idea of the invention may be implemented in various ways. The invention and its embodiments are thus not limited to the examples described above, instead they may vary within the scope of the claims.

The invention claimed is:

1. A control arrangement for providing a plurality of phase-coherent oscillating signals, the control arrangement comprising:
a reference clock input arrangement for providing a high-frequency reference clock signal, a plurality of modules each comprising a plurality of channels for providing the plurality of phase-coherent oscillating signals, a first distribution arrangement for distributing the high-frequency reference clock signal in a phase-coherent manner to the plurality of modules, within each of the plurality of modules a second distribution arrangement for distributing the high-frequency reference clock signal in a phase-coherent manner to the plurality of channels of the respective module, and within each of the plurality of channels a first phase-locked loop configured to upconvert the high-frequency reference clock signal for providing one of the plurality of phase-coherent oscillating signals.

2. The control arrangement according to claim 1, wherein the reference clock input arrangement comprises:

a reference clock signal input for providing an initial reference clock signal; and an initial phase-locked loop coupled to the reference clock signal input and configured to upconvert the initial reference clock signal for providing the high-frequency reference clock signal.

3. The control arrangement according to claim 1, wherein reference clock input arrangement comprises a motherboard arrangement and wherein each of the plurality of modules comprises a circuit board.

4. The control arrangement according to claim 1, wherein reference clock input arrangement comprises a motherboard arrangement and wherein the plurality of modules is arranged for pluggable coupling to the motherboard arrangement.

5. The control arrangement according to claim 1, wherein each of the plurality of modules comprises a plurality of shields for radio-frequency (rf) shielding of each of the plurality of channels of the respective module.

6. The control arrangement according to claim 2, wherein the initial reference clock signal has a frequency of 5-50 MHz.

7. The control arrangement according to claim 1, wherein the high-frequency reference clock signal has a frequency of 100-250 MHz and/or the plurality of phase-coherent oscillating signals has a frequency of 1-15 GHz.

8. The control arrangement according to claim 1, wherein the amplitude and/or frequency of at least one of the plurality of phase-coherent oscillating signals is adjustable by a digital control signal for the respective channel.

9. The control arrangement according to claim 1, comprising a control connection for remote adjustment of the frequency and/or amplitude of the plurality of phase-coherent oscillating signals.

10. A generator arrangement for providing a plurality of phase-coherent oscillating signals, the generator arrangement comprising the control arrangement according to claim 1 and a reference clock generator arranged for providing a reference clock signal for providing the high-frequency reference clock signal.

11. A quantum computing arrangement comprising a control arrangement according to claim 1 and a quantum computing system, wherein the control arrangement is coupled to the quantum computing system for providing a plurality of phase-coherent oscillating signals for the quantum computing system.

12. A method for providing a plurality of phase-coherent oscillating signals, the method comprising:

receiving a high-frequency reference clock signal, distributing the high-frequency reference clock signal in a phase-coherent manner to a plurality of modules, within each of the plurality of modules distributing the high-frequency reference clock signal in a phase-coherent manner to a plurality of channels of the respective module, and within each of the plurality of channels upconverting the high-frequency reference clock signal for providing one of the plurality of phase-coherent oscillating signals.

13. The method according to claim 12, comprising:

receiving an initial reference clock signal, and upconverting the initial reference clock signal for providing the high-frequency reference clock signal.

14. The method according to claim 13, wherein the initial reference clock signal has a frequency of 5-50 MHz.

15. The method according to claim 12, wherein the high-frequency reference clock signal has a frequency of 100-250 MHz and/or the plurality of phase-coherent oscillating signals has a frequency of 1-15 GHz.

16. The method according to claim 13, comprising adjusting the amplitude and/or frequency of at least one of the plurality of phase-coherent oscillating signals by a digital control signal for the respective channel.

* * * * *